United States Patent
Kowatari

(10) Patent No.: US 7,840,924 B2
(45) Date of Patent: Nov. 23, 2010

(54) APPARATUS, METHOD, AND PROGRAM FOR VERIFYING LOGIC CIRCUIT OPERATING WITH MULTIPLE CLOCK SIGNALS

(75) Inventor: Satoshi Kowatari, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 193 days.

(21) Appl. No.: 12/017,764

(22) Filed: Jan. 22, 2008

(65) Prior Publication Data

US 2008/0198957 A1 Aug. 21, 2008

(30) Foreign Application Priority Data

Feb. 20, 2007 (JP) .............................. 2007-040014

(51) Int. Cl.
 *G06F 17/50* (2006.01)
(52) U.S. Cl. .................. 716/6; 716/4; 716/5; 703/19
(58) Field of Classification Search ................. 716/4–6; 703/19
 See application file for complete search history.

(56) References Cited

U.S. PATENT DOCUMENTS

| 7,120,883 B1 * | 10/2006 | van Antwerpen et al. ........ 716/6 |
| 7,197,582 B2 * | 3/2007 | Chelcea et al. ................. 710/57 |
| 7,356,789 B2 * | 4/2008 | Ly et al. ........................ 716/5 |
| 7,594,211 B1 * | 9/2009 | Tian et al. ...................... 716/6 |
| 2002/0199173 A1 * | 12/2002 | Bowen ......................... 717/129 |
| 2005/0268265 A1 * | 12/2005 | Ly et al. ......................... 716/6 |

FOREIGN PATENT DOCUMENTS

| JP | 2001-229211 | 8/2001 |
| JP | 2005-031890 | 2/2005 |
| JP | 2005-284426 | 10/2005 |

OTHER PUBLICATIONS

"Clock Domain Crossings (CDC)", http://www.metorg.co.jp.techpaper/cdc/index.html.
"O-In Clock-Domain Crossing", Advanced Verification and Debugging DataSheet, http://www.mentorg.co.jp.

\* cited by examiner

*Primary Examiner*—Naum B Levin
(74) *Attorney, Agent, or Firm*—Fujitsu Patent Center

(57) ABSTRACT

A verification apparatus that can verify a circuit in a shorter time while taking possible metastability into consideration. A clock domain crossing (CDC) detector finds CDC paths between circuit elements operating with different clocks in the circuit. A delay generator inserter produces a delay-insertable version of the circuit by embedding a delay generator into each found CDC path. When activated, those delay generators give a signal delay to the corresponding CDC paths. A simulator simulates the behavior of the delay-insertable circuit by using a specified simulation pattern while deactivating the embedded delay generators. A delay pattern generator creates a delay pattern from simulation results, which activates or deactivates delay generators individually so as to produce signal delays that could affect output signals of the circuit. A verifier verifies the circuit by applying the delay pattern to each delay generator in the circuit.

9 Claims, 17 Drawing Sheets

15 WAYS

2 WAYS

APPARATUS, METHOD, AND PROGRAM FOR VERIFYING LOGIC CIRCUIT OPERATING WITH MULTIPLE CLOCK SIGNALS

CROSS-REFERENCE TO RELATED APPLICATIONS

This application is based upon and claims the benefits of priority from the prior Japanese Patent Application No. 2007-040014, filed on Feb. 20, 2007, the entire contents of which are incorporated herein by reference.

BACKGROUND OF THE INVENTION

1. Field of the Invention

The present invention relates to an apparatus, method, and computer program for verifying a logic circuit, and more particularly to an apparatus, method, and computer program for verifying a circuit that operates with two or more clock signals.

2. Description of the Related Art

The design of semiconductor integrated circuits becomes more and more complex to implement many functions densely into a single chip. This leads to an increased need for more accurate and less time-consuming simulation and verification techniques. Particularly in communications applications, the circuit may use different clocks for sending and receiving signals. An interface between two circuits operating with different clocks is referred to as a clock domain crossing (CDC) path. CDC paths are susceptible to metastability problems, which cannot be tested by an ordinary logical verification process. It is therefore important, when testing such a logic circuit, to verify the effects of metastability on its internal CDC paths.

As an example of metastability, FIGS. 12A and 12B show how a flip-flop circuit 500 behaves when it encounters metastability. Specifically, FIG. 12B is a timing diagram showing relationships between a clock input signal CK, a data input signal D, and an output signal Q, where the symbols C1, C2, C3, and C4 represent four consecutive clock cycle periods. In the case where the data input signal D is high at a rising edge of clock signal CK in cycle C2, the output signal Q is supposed to go up at the beginning of cycle C2. If the change of the data input signal D occurs immediately before that clock edge, the output signal Q may rise, not in cycle C2, but in cycle C3, thus causing a delay of data propagation. As this example shows, the output Q of a flip-flop 500 can become unstable in the case where its data input signal D changes immediately before or after the rising edge of clock signal CK. This condition is known as metastability.

CDC paths may encounter metastability particularly when the input signal changes during a short period in which two different clock signals rise nearly at the same time. FIGS. 13 and 14 show an example of failure caused by metastability at a CDC path. Specifically, FIG. 13 shows a logic circuit operating with two clock signals clk1 and clk2. An input signal D1 is supplied to one input of an AND gate 501 and to a flip-flop 502, whose output is fed to another flip-flop 503. The output signal (D1$t$) of this flip-flop 503 is then supplied to a subsequent flip-flop 504. In other words, the flip-flops 502, 503, and 504 are connected in series.

Another input signal D2 is entered to the other input terminal of the AND gate 501. The output of this AND gate 501 is fed to a flip-flop 505, and the output of that flip-flop 505 is directed to another flip-flop 506. The output signal (D2$t$) of the flip-flop 506 is supplied to a subsequent flip-flop 507. In other words, the flip-flops 505, 506, and 507 are connected in series. An AND gate 508 receives the output signals of flip-flops 504 and 507 and sends its own output to yet another flip-flop 509. This flip-flop 509 produces an output signal OUT, the final result of logic operations performed by the circuit of FIG. 13.

In the logic circuit of FIG. 13, one group of flip-flops 502 and 505 operates with a first clock signal clk1, while the other group of flip-flops 503, 504, 506, 507, and 509 operates with a second clock signal clk2. The flip-flops 502 and 503 are connected in series while they belong to different clock domains. The connection between these two flip-flops 502 and 503 constitutes a CDC path 510, which is subject to the effects of metastability. Likewise, the connection between two flip-flops 505 and 506 constitutes another CDC path 511, which is also subject to the effects of metastability.

As FIG. 14 shows, the input signal D1 changes at a rising edge of the first clock signal clk1 during cycle C11, the new state of which is taken into flip-flops 502 and 505 at the next rising edge of clk1. Flip-flops 503 and 506 capture the outputs of the flip-flops 502 and 505 at a rising edge of the second clock signal clk2 during cycle C21. From the viewpoint of clk2 domain, however, the change in those outputs may be too close to that rising edge of clk2 for the flip-flops 503 and 506 to take in the new signal state correctly, which could thus cause a metastability. FIG. 14 shows an example of such results. Specifically, the flip-flop 503 outputs a signal D1$t$ that changes in synchronization with a rising edge of clk2, which, in the present case, goes high in cycle C22 with a one-clock delay. The flip-flop 506 in the other CDC path 511, on the other hand, may operate in an expected way, changing its output D2$t$ at a rising edge of clk2 during cycle C21. If this is the case, the output signal OUT will stay low in cycle C23 although that cycle is where the signal OUT is supposed to be asserted.

Researchers in this field have proposed several techniques to test such effects of metastability in a logic circuit design. See, for example, Japanese Unexamined Patent Application Publication Nos. 2005-284426 and 2001-229211. One proposed technique forces CDC paths to produce signal delays so as to determine whether the circuit under test is immune to metastability.

FIG. 15 gives an overview of a conventional verification apparatus. This verification apparatus 600 is formed from the following elements: a circuit database 601, a CDC detector 602, a CDC path database 603, a delay generator inserter 604, a delay-insertable circuit database 605, a verifier 606, and a scenario database 607. The circuit database 601 stores data of a circuit under test. The CDC detector 602 searches the circuit under test to find CDC paths in the circuit under test, and the CDC path database 603 records each found CDC path. The delay generator inserter 604 inserts a delay generator to each CDC path so as to emulate a signal delay that could be induced by metastability. The delay-insertable circuit database 605 stores data of circuit which includes such delay generators. The verifier 606 verifies the circuit under test by giving a specific simulation pattern to the delay-insertable circuit. Such simulation patterns are referred to herein as "scenarios," and the scenario database 607 stores a plurality of scenarios for simulation.

FIG. 16 is a flowchart showing a conventional verification method. First, the CDC detector 602 searches the circuit database 601 to find CDC paths in the circuit under test (step S90). When a CDC path is found, the delay generator inserter 604 inserts a delay generator to that path (step S91). The verifier 606 determines whether all scenarios stored in the scenario database 607 have been tested (step S92), and if so, the verifier 606 terminates the test. If there are untested scenarios, the verifier 606 selects a new specific scenario from those stored in the scenario database 607 (step S93).

Now that a scenario is selected, the verifier 606 chooses randomly a CDC path in the circuit under test and simulates the behavior of the circuit. During this simulation, the verifier 606 activates an embedded delay generator to forcibly produce a delay in the CDC path, assuming the occurrence of metastability (step S94). The verifier 606 determines whether any failure is found in the simulation (step S95). If there is a failure, the verification apparatus 600 permits the user to modify the circuit (step S96) and then returns to step S90 to repeat the above process. If there are no failures found, then the verification apparatus 600 determines whether the simulation has been done as many times as specified (step S97). If so, the verification apparatus 600 goes back to step S92 to attempt another scenario. If not, the verification apparatus 600 returns to step S94 to choose another CDC path to continue the simulation. The conventional verification apparatus 600 operates in this way to test a logic circuit, considering the effects of metastability.

Japanese Unexamined Patent Application Publication No. 2005-31890 discloses a technique to analyze a sequential circuit susceptible to metastability. This technique assigns an abnormal delay time to a specified sequential circuit to simulate the effect of metastability, while assigning normal delay times to other circuits.

The effects of metastability may not always manifest themselves at outputs of the circuit. Rather, there are many such cases where a metastable state is confined within a limited portion of the circuit and never appears at its output pins. FIG. 17 is a timing diagram showing an example case where the circuit's output is not affected by delays in a CDC path. This example is a result of a simulation using a specific scenario for the circuit discussed in FIG. 13.

In the case, for example, where the input signal D1 is fixed at a low level, one input of the AND gate 508 (FIG. 13) is always driven to low, meaning that the output of the AND gate 508 will never become high. While the second CDC path 511 may encounter metastability, the resulting one-clock delay in signal D2$t$ (see FIG. 17) would not affect the output signal OUT. This means that the behavior of the circuit of FIG. 13 does not change in this particular scenario, no matter whether metastability occurs or not. In other words, it is a waste of time to test the effects of metastability when such a scenario is selected. The foregoing conventional verification methods apply all scenarios exhaustively, despite the fact that some of those scenarios do not affect outputs of the circuit under test. Trying every scenario in this case means consuming a long time to verify the circuit.

SUMMARY OF THE INVENTION

According to one of the aspect of an embodiment, an apparatus for verifying a circuit that operates with a plurality of different clock signals. This apparatus includes the following elements: a clock domain crossing (CDC) detector, a delay generator inserter, a simulator, a delay pattern generator, and a verifier. The CDC detector finds CDC paths between circuit elements operating with different clocks in the circuit. The delay generator inserter produces a delay-insertable version of the circuit by embedding a delay generator into each CDC path found in the circuit. The delay generators, when activated, give a signal delay to the corresponding CDC paths. The simulator performs a simulation of the delay-insertable circuit by using a specified simulation pattern while deactivating the delay generators embedded in the delay-insertable circuit. The delay pattern generator generates a delay pattern from results of the simulation. This delay pattern activates or deactivates the delay generators individually so as to produce signal delays that could affect output signals of the delay-insertable circuit. Finally the verifier verifies the circuit by applying the delay pattern to the delay generators in the delay-insertable circuit.

According to another aspect of the embodiment, a method of verifying a circuit that operates with a plurality of different clock signals. This method includes the following actions: (a) finding CDC paths between circuit elements operating with different clocks in the circuit; (b) producing a delay-insertable version of the circuit by embedding a delay generator into each CDC path found in the circuit, wherein the delay generators, when activated, give a signal delay to the corresponding CDC paths; (c) performing a simulation of the delay-insertable circuit by using a specified simulation pattern while deactivating the delay generators embedded in the delay-insertable circuit; (d) generating a delay pattern from results of the simulation, the delay pattern activating or deactivating the delay generators individually so as to produce signal delays that could affect output signals of the delay-insertable circuit; and (e) verifying behaviors of the circuit by applying the delay pattern to the delay generators in the delay-insertable circuit.

According to the other aspect of the embodiment, a computer-readable medium storing a program for verifying a circuit that operates with a plurality of different clock signals. This computer program causes a computer to function as the following elements: a clock domain crossing (CDC) detector, a delay generator inserter, a simulator, a delay pattern generator, and a verifier. The CDC detector finds CDC paths between circuit elements operating with different clocks in the circuit. The delay generator inserter produces a delay-insertable version of the circuit by embedding a delay generator into each CDC path found in the circuit. The delay generators, when activated, give a signal delay to the corresponding CDC paths. The simulator performs a simulation of the delay-insertable circuit by using a specified simulation pattern while deactivating the delay generators embedded in the delay-insertable circuit. The delay pattern generator generates a delay pattern from results of the simulation. This delay pattern activates or deactivates the delay generators individually so as to produce signal delays that could affect output signals of the delay-insertable circuit. Finally the verifier verifies the circuit by applying the delay pattern to the delay generators in the delay-insertable circuit.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
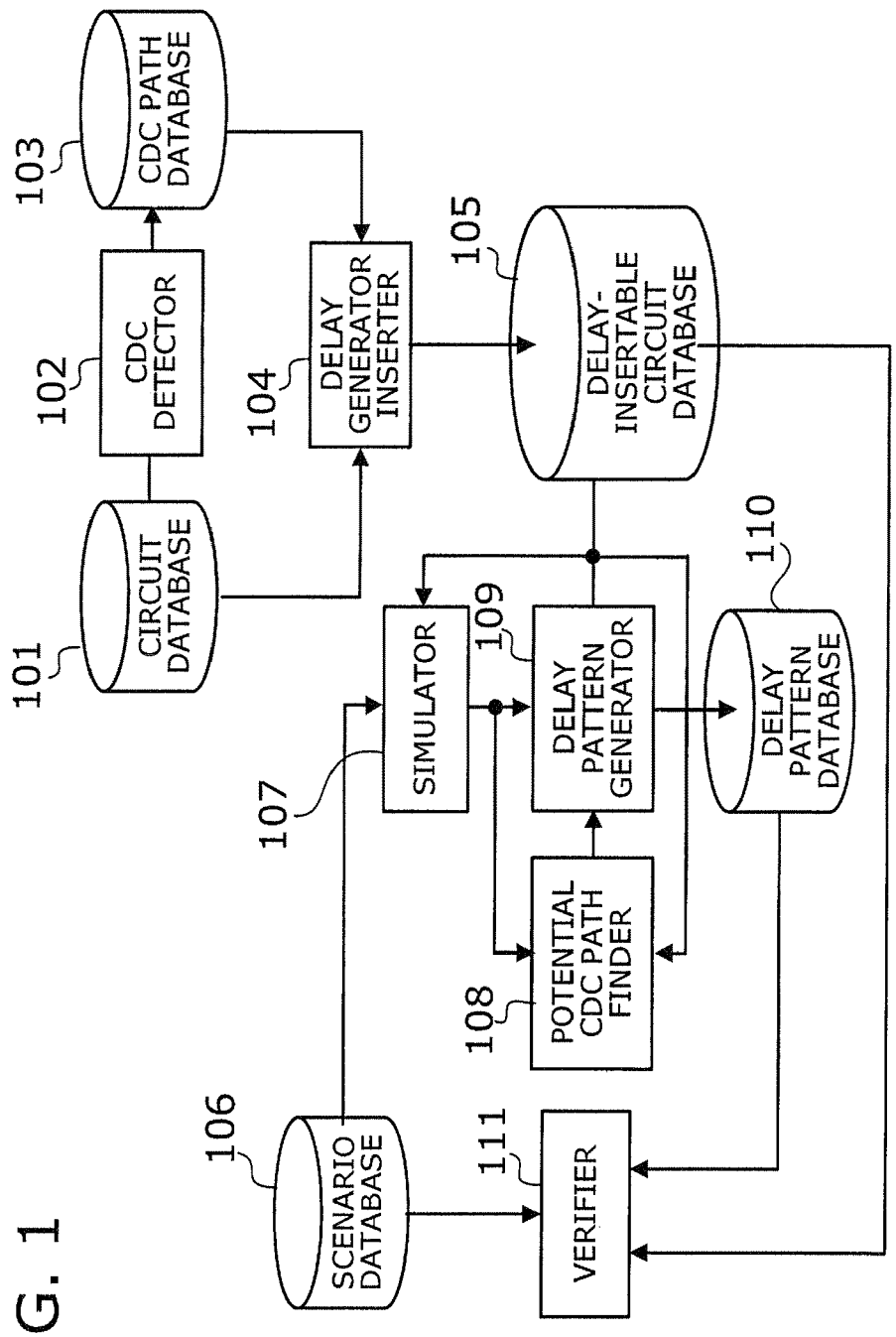
FIG. 1 is a functional block diagram of a verification apparatus according to a first embodiment of the present invention.

Preferred embodiments of the present invention will now be described in detail below with reference to the accompanying drawings, wherein like reference numerals refer to like elements throughout.

FIG. 1 is a functional block diagram of a verification apparatus according to a first embodiment of the present invention. The illustrated verification apparatus 100 verifies circuit data generated by a logic design tool. This verification apparatus 100 has a circuit database 101 to store the data of a circuit under test, a CDC detector 102 to search the circuit under test to find CDC paths, and a CDC path database 103 to store the information about CDC paths that are found.

The verification apparatus 100 also includes a delay generator inserter 104 to embed a delay generator into each found CDC path so as to emulate a signal delay that could be induced by metastability. The embedded delay generators can be activated or deactivated individually as necessary. When activated, they give a signal delay to the corresponding CDC paths. The resulting version of the circuit contains such delay generators and is thus referred to as a delay-insertable circuit. The verification apparatus 100 includes a delay-insertable circuit database 105 to store information about the delay-insertable circuit and a scenario database 106 to store a plurality of scenarios for simulation.

According to the first embodiment, the verification apparatus 100 further includes a simulator 107, a potential CDC path finder 108, a delay pattern generator 109, a delay pattern database 110, and a verifier 111. The simulator 107 simulates how the delay-insertable circuit behaves, by using a scenario stored in the scenario database 106. Based on the simulation results provided by the simulator 107, the potential CDC path finder 108 examines each CDC path in the delay-insertable circuit to find CDC paths that could encounter metastability. In this process, the potential CDC path finder 108 also identifies a time point at which metastability could occur. Suppose, for example, that the input signal of a flip-flop in a CDC path changes at some time point that is close to an active edge of its clock signal. Since this condition may bring the CDC path into a metastable state, the potential CDC path finder 108 extracts that CDC path and time point as being susceptible to metastability. The potential CDC path finder 108 collects such CDC paths in list form, for example.

From the delay-insertable circuit and its simulation result, the delay pattern generator 109 produces delay patterns that could affect output signals of the delay-insertable circuit. The delay pattern database 110 stores those delay patterns produced by the delay pattern generator 109. The verifier 111 reads a scenario and delay patterns to cause a delay at each delay generator in the delay-insertable circuit, thus testing whether any failure occurs due to metastability.

The above-described verification apparatus 100 of the first embodiment operates as follows: First, the CDC detector 102 searches a circuit under test stored in the circuit database 101 to find CDC paths in the circuit and enters them as entries for the CDC path database 103. The delay generator inserter 104 reads a record of each CDC path in the CDC path database 103 and embeds a delay generator into the CDC path, thereby producing a delay-insertable version of the circuit under test.

Figure 2:
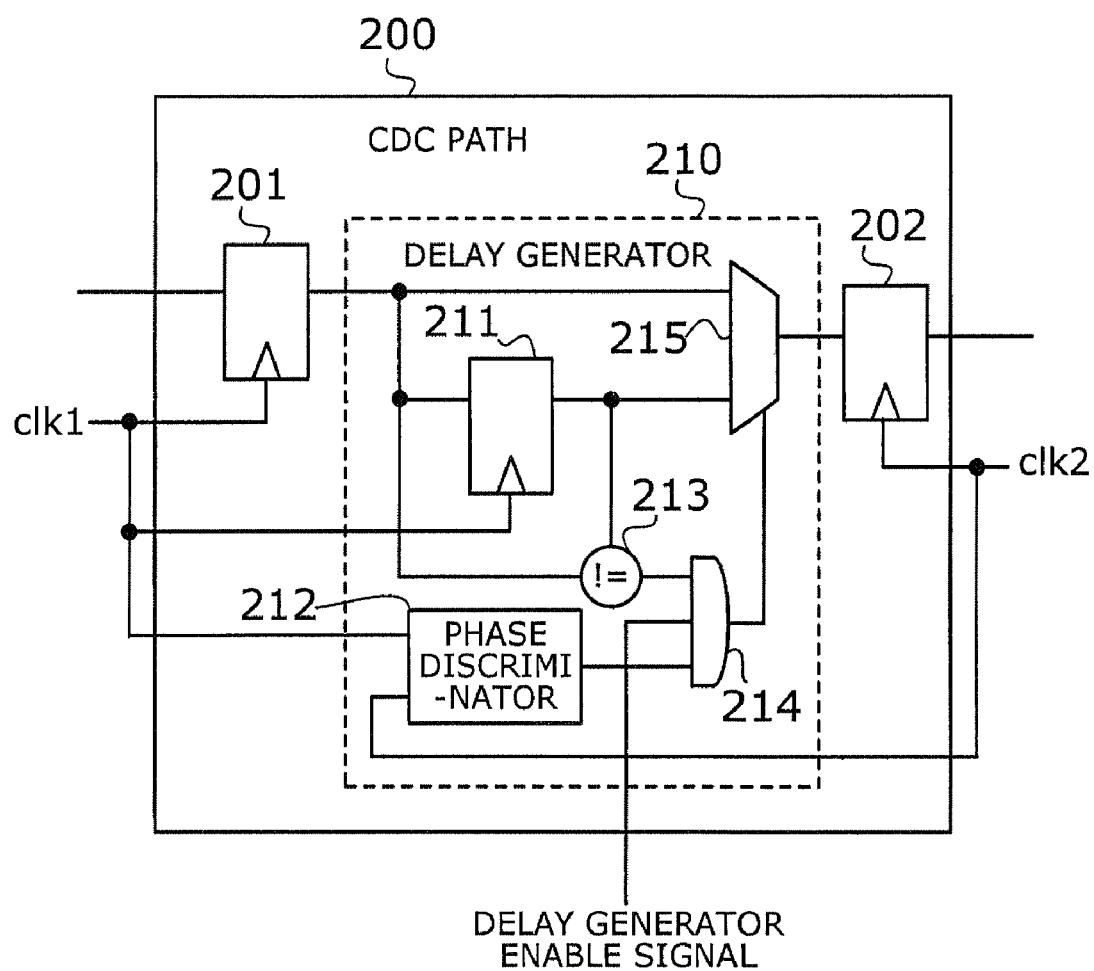
FIG. 2 is a schematic diagram showing an example of a CDC path that is found, in which a delay generator is embedded.

FIG. 2 is a schematic diagram showing an example of a CDC path that is found, in which a delay generator is embedded. The illustrated CDC path 200 includes two flip-flops 201 and 202 that operate in synchronization with different clock signals clk1 and clk2. The delay generator inserter 104 inserts a delay generator 210 to the found CDC path 200. This delay generator 210 can be activated or deactivated by controlling a delay generator enable signal.

The delay generator 210 is formed from, for example, a flip-flop 211, a phase discriminator 212, a comparator 213, an AND gate 214, and a selector 215. The flip-flop 211 and its preceding flip-flop 201 operate with a first clock signal clk1. The flip-flop 211 captures the output of the preceding flip-flop 201 at each rising edge of clk1. In other words, the flip-flop 211 maintains a previous state of that output signal by delaying it by one clock cycle.

The phase discriminator 212 watches the relationship between two clock signals clk1 and clk2 in terms of phase. When an active edge (e.g., rising edge) of the first clock signal clk1 is close to that of the second clock signal clk2, the phase discriminator 212 outputs a logic signal "1" to indicate the closeness. When one clock's active edge is apart from the other's, the phase discriminator 212 outputs "0."

The comparator 213 compares the output of the flip-flop 201 with that of the flip-flop 211. If those two output signals disagree, then the comparator 213 outputs a logic signal "1." If the two output signals coincide with each other, the comparator 213 outputs "0."

The AND gate 214 receives signals from the phase discriminator 212 and comparator 213, together with a delay generator enable signal. Only if all those input signals are "1," then the AND gate 214 outputs "1." If either input is "0," then the AND gate 214 outputs "0." This output of the AND gate 214 is used as a selection control signal for the selector 215 to select an output signal of either the flip-flop 201 or flip-flop 211. More specifically, if the selection control signal is "0," the selector 215 selects the former flip-flop 201. If the selection control signal is "1," the selector 215 selects the latter flip-flop 211, thus producing a one-clock delayed version of the output signal of the former flip-flop 201.

The above-described delay generator 210 functions in the CDC path 200 when the delay generator enable signal is set to "1." The delay generator 210 generates a delay of one clock cycle in synchronization with a transition of the input to the CDC path 200 when the two clock signals clk1 and clk2 come close to each other.

The delay-insertable circuit database 105 stores data of the circuit under test that contains such delay generators 210. The simulator 107 simulates the behavior of this delay-insertable circuit, using a scenario selected from among those stored in the scenario database 106. The potential CDC path finder 108 examines the simulation result to find CDC paths and possible times of metastability by seeking a transition of an input signal in synchronization with two clock signals having close active edges.

The simulation result is also supplied to the delay pattern generator 109, along with the data of the delay-insertable circuit. The delay pattern generator 109 sets "1" or "0" to the delay generator enable signal of each CDC path, thus imitating a situation where some CDC paths are experiencing metastability. The delay pattern generator 109 then generates delay patterns that could affect outputs of the delay-insertable circuit (more details later). A known method or tool for model checking may be used to implement those functions of the delay pattern generator 109.

In the process of generating delay patterns, the delay pattern generator 109 may not necessarily examine every CDC and every possible timing condition. Rather, the delay pattern generator 109 focuses on the CDCs and time points that the potential CDC path finder 108 has discovered.

The delay pattern database 110 stores the delay patterns produced by the delay pattern generator 109. The verifier 111 selects a scenario executed by the simulator 107 and applies each produced delay pattern to the selected scenario, thus verifying the delay-insertable circuit in terms of whether the simulated metastability affects output signals of the circuit.

Figure 3A:
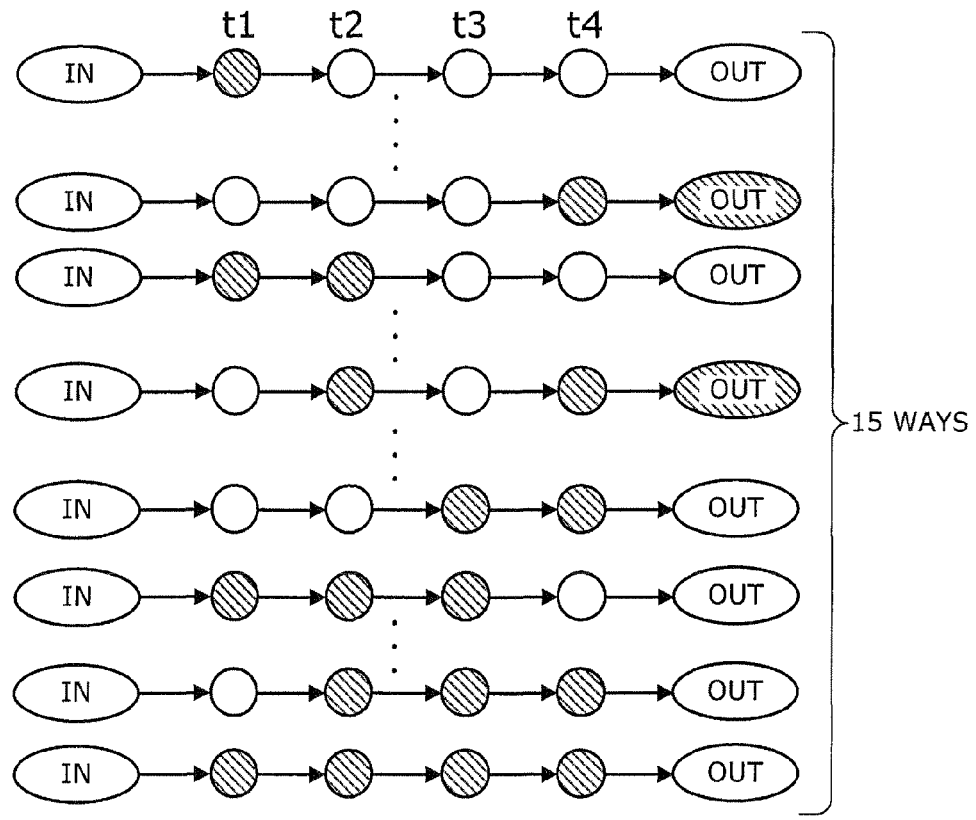
FIGS. 3A and 3B depict how the verification apparatus works according to the first embodiment.
Figure 3B:
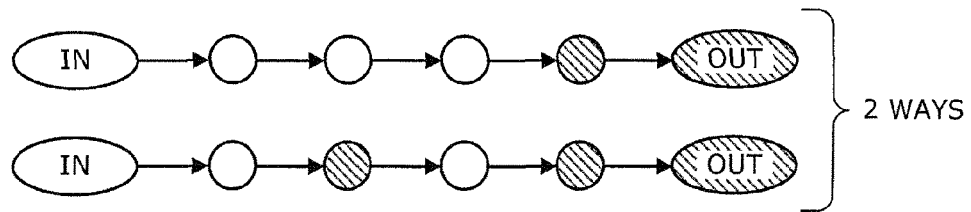

FIGS. 3A and 3B depict how the verification apparatus works according to the first embodiment. Specifically, FIG. 3A shows the case where data entered to an input pin IN may encounter metastability before its corresponding output signal appears at an output pin OUT. Metastability could occur at any of the four time points t1, t2, t3, and t4 indicated by the circles in FIG. 3A. Apparently there are fifteen possible combinations of potentially metastable time points. The hatched circles represent metastability, and the hatched ovals indicate output signals affected by the metastability. It is assumed in the example of FIG. 3A that the output signal is affected by metastability in only two delay patterns (i.e., the second and fourth combinations of potentially metastable time points).

Conventionally, all the fifteen delay patterns have to be tested, although only two of them (indicated by the hatched ovals) affect the output signal OUT. In contrast, the verification apparatus 100 of the first embodiment only tests the two patterns relevant to the output signal OUT as shown in FIG. 3B.

As can be seen from the above, the verification apparatus 100 of the first embodiment verifies the circuit under test in terms of its immunity to metastability by generating delay patterns that could change the behavior of output signals of the circuit, while skipping meaningless cases where metastability is confined within a limited portion of the circuit and never appears at output pins. This optimized scope of verification greatly reduces the time required for circuit verification. In addition, the verification apparatus 100 generates delay patterns, not exhaustively for every existing CDC path and time point, but selectively for a limited number of CDC paths and time points that are susceptible to metastability, thus further reducing the verification time.

First Embodiment Details

This section will give more details about the verification apparatus 100 according to the first embodiment of the present invention.

Figure 4:
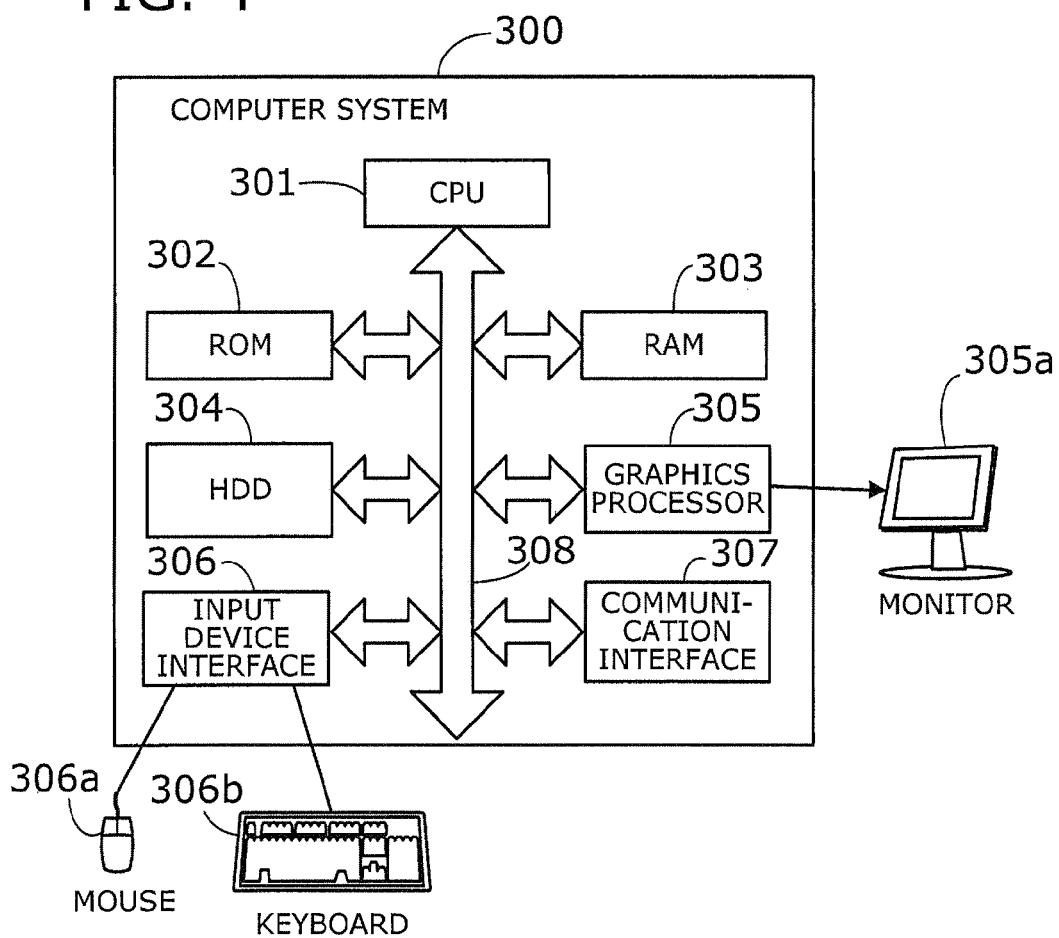
FIG. 4 shows a specific hardware configuration of the verification apparatus according to the first embodiment.

FIG. 4 shows a specific hardware configuration of the verification apparatus 100. Specifically, the verification apparatus 100 is implemented on a computer system 300 including the following components: a central processing unit (CPU) 301, a read-only memory (ROM) 302, a random access memory (RAM) 303, a hard disk drive (HDD) 304, a graphics processor 305, an input device interface 306, and a communication interface 307.

The CPU 301 controls various parts of the computer system 300 according to programs and data stored in the ROM 302 and/or HDD 304, so as to provide the functions of the CDC detector 102, delay generator inserter 104, simulator 107, potential CDC path finder 108, delay pattern generator 109, and verifier 111 discussed in FIG. 1. The ROM 302 stores basic programs and data that the CPU 301 executes and manipulates. The RAM 303 serves as temporary storage for programs and scratchpad data that the CPU 301 executes and manipulates at runtime. The HDD 304 stores circuit data and simulation scenarios, in addition to operating system (OS) programs to be executed by the CPU 301.

The graphics processor 305 produces video images in accordance with drawing commands from the CPU 301 and displays them on a screen of a monitor 305a coupled thereto. What is displayed on the monitor screen includes, for example, schematic diagrams of a circuit under test, simulation results, and verification results.

The input device interface 306 is used to receive signals from external input devices, such as a mouse 306a and a keyboard 306b. Those user input signals are supplied to the CPU 301 via the bus 308. The communication interface 307 is connected to, for example, a local area network of a company, a wide area network (WAN), and/or the Internet to allow the CPU 301 to exchange data with other computers (not shown) on such networks. The network may be used to share the circuit database 101 and other databases (FIG. 1) with other computers.

Figure 5:
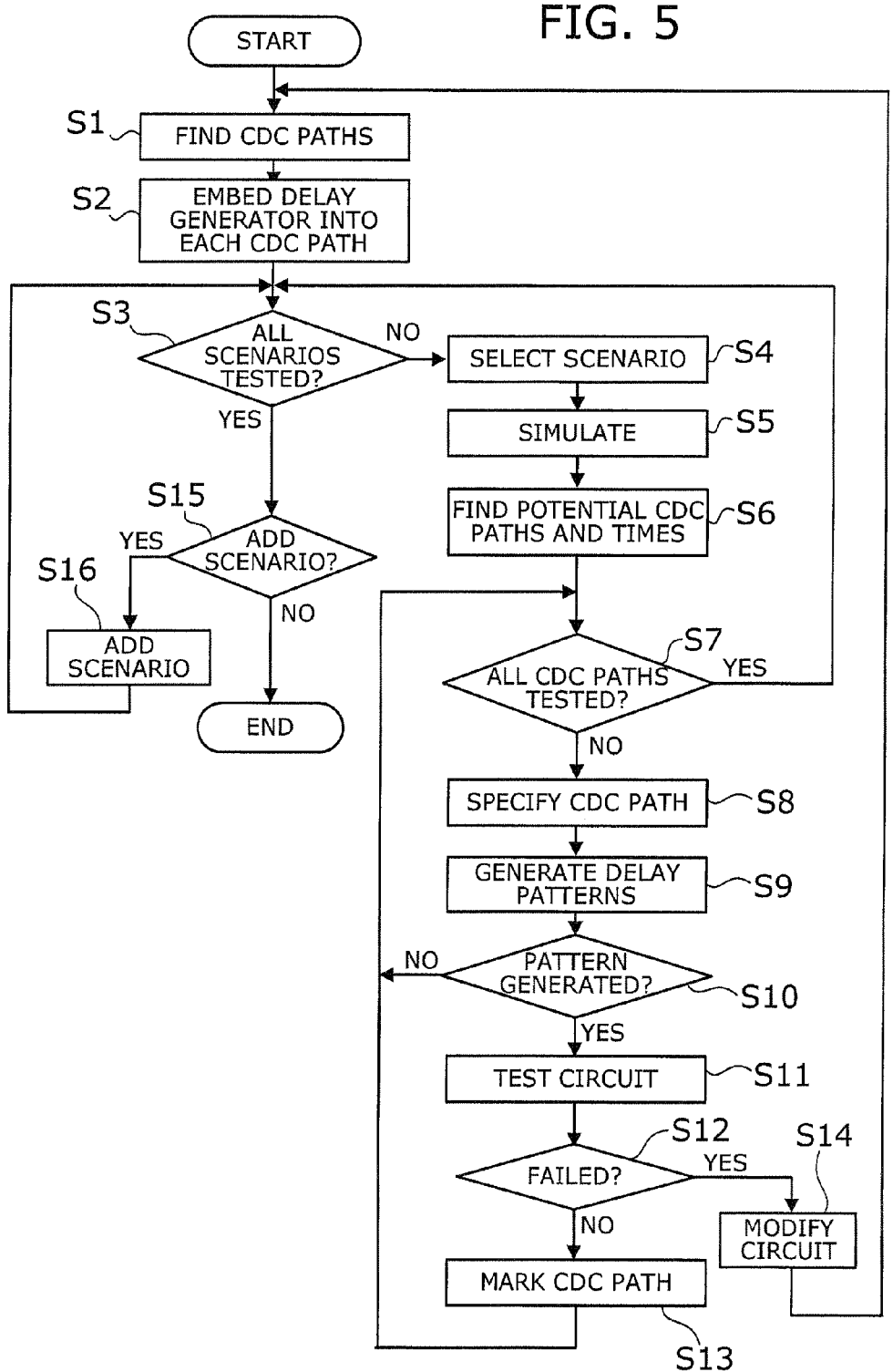
FIG. 5 is a flowchart of a verification method performed by the verification apparatus of the first embodiment.

On the above-described hardware platform, the verification apparatus 100 of the first embodiment operates as shown in the flowchart of FIG. 5. The CPU 301 starts the process with reading design data of the circuit under test from, for example, the HDD 304. The CPU 301 finds CDC paths in the circuit and stores their records in the HDD 304 (step S1). Then the CPU 301 embeds a delay generator into each CDC path that is found (step S2).

The CPU 301 determines whether all scenarios have been tested by simulation (step S3). If there are any untested scenarios, then the CPU 301 selects a new scenario (step S4) and executes a simulation with the selected scenario (step S5). The simulation result may reveal a potential risk of metastability in some CDC paths. That is, a CDC path could experience metastability when its input signal changes while two different clock signals come close to each other. From the simulation result, the CPU 301 extracts CDC paths in such conditions, along with specific time points of possible metastability (step S6). The CPU 301 determines whether every extracted CDC path has been tested (step S7). If so, the process goes back to step S3. If there are untested CDC paths, then the CPU 301 specifies a new CDC path for testing (step S8). Or alternatively, the CPU 301 may specify all untested CDC paths at a time.

From the simulation results, along with specified CDC paths and time points, the CPU 301 produces delay patterns that could affect outputs of the delay-insertable circuit (step S9). The CPU 301 determines whether it has successfully produced such delay patterns (step S10). If no such delay patterns are produced, the process returns to step S7. If delay patterns are produced, then the CPU 301 selects the scenario used in the preceding simulation and tests the immunity from metastability by giving delays to the delay-insertable circuit according to each delay pattern (step S11). The CPU 301 determines whether the test has passed or failed (step S12). If no failures are found, the CPU 301 marks the CDC path that is tested (step S13) and returns to step S7. If any failure is found, the CPU 301 outputs a warning message on a screen of the monitor 305*a*. The user modifies the circuit accordingly and stores the modified circuit data into the HDD 304 (step S14). With the new version of the circuit data, the CPU 301 repeats the above process from step S1.

Referring back to step S3, if all the scenarios are done, the CPU 301 may send a message on the monitor 305*a* so as to prompt the user to specify whether to add a new scenario (step S15). If the user has a new scenario, the CPU 301 returns to step S3 with the newly added scenario (step S16). If there are no more scenarios, the CPU 301 closes the verification process.

Delay Pattern Generation

This section gives details about how to generate delay patterns at step S9 of the flowchart shown in FIG. 5. The present embodiment uses a model checking method to generate delay patterns that could affect output signals of a delay-insertable circuit. The method generates delay patterns according to input and output constraints for the circuit under test.

Figure 6:
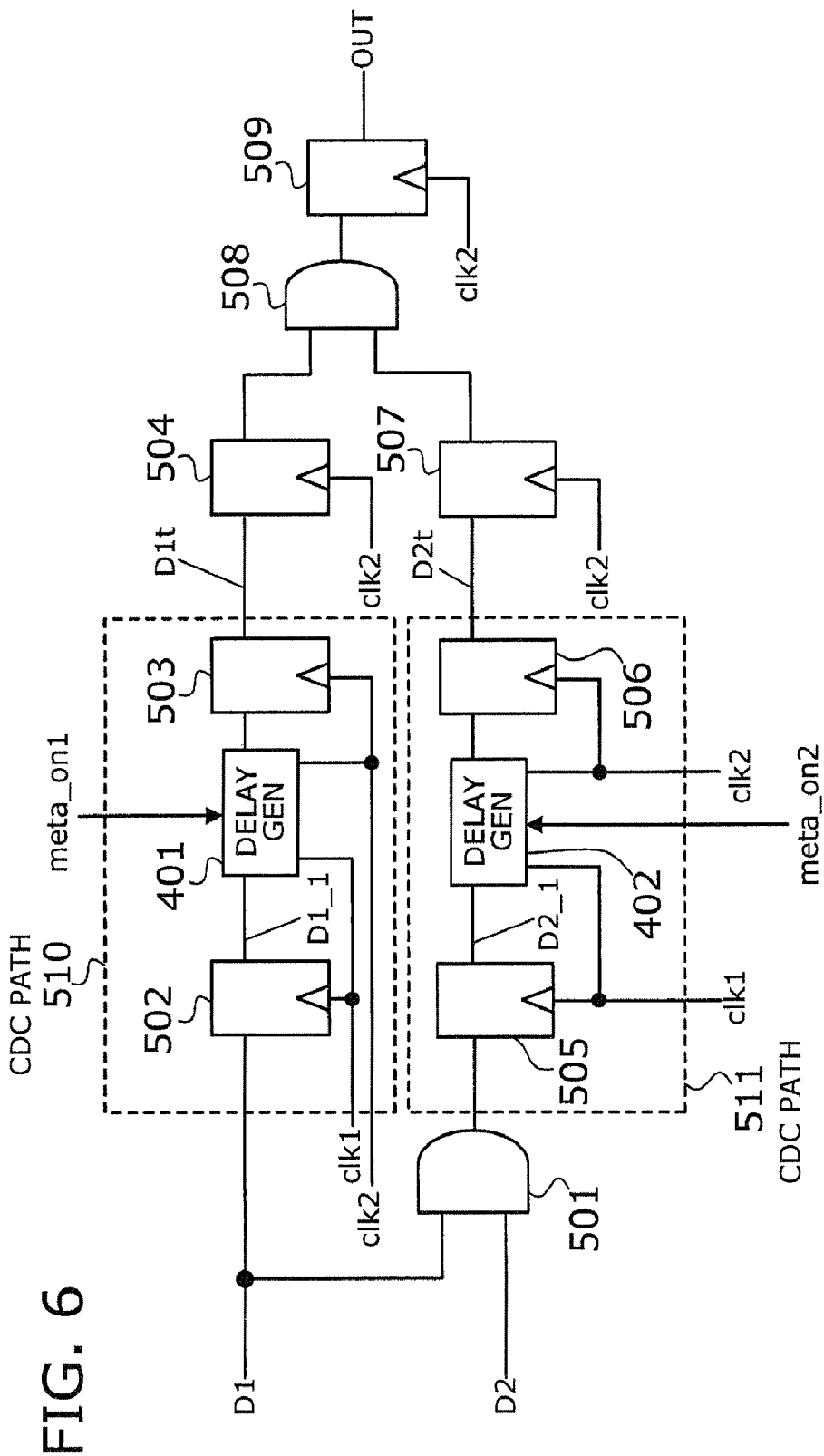
FIG. 6 shows an example of a delay-insertable circuit.
Figure 13:
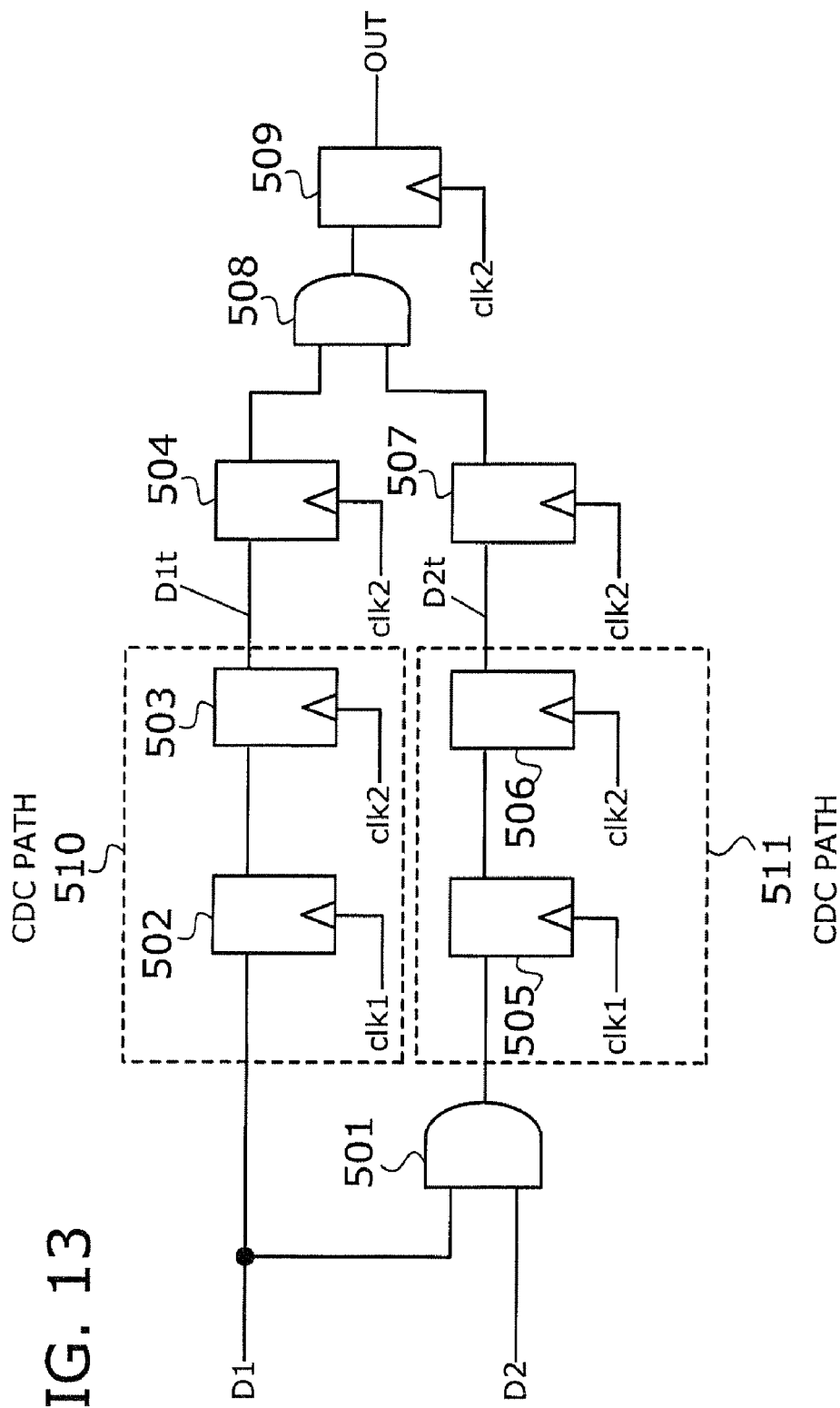
FIGS. 13 and 14 show an example of failure caused by metastability at a CDC path.
Figure 14:
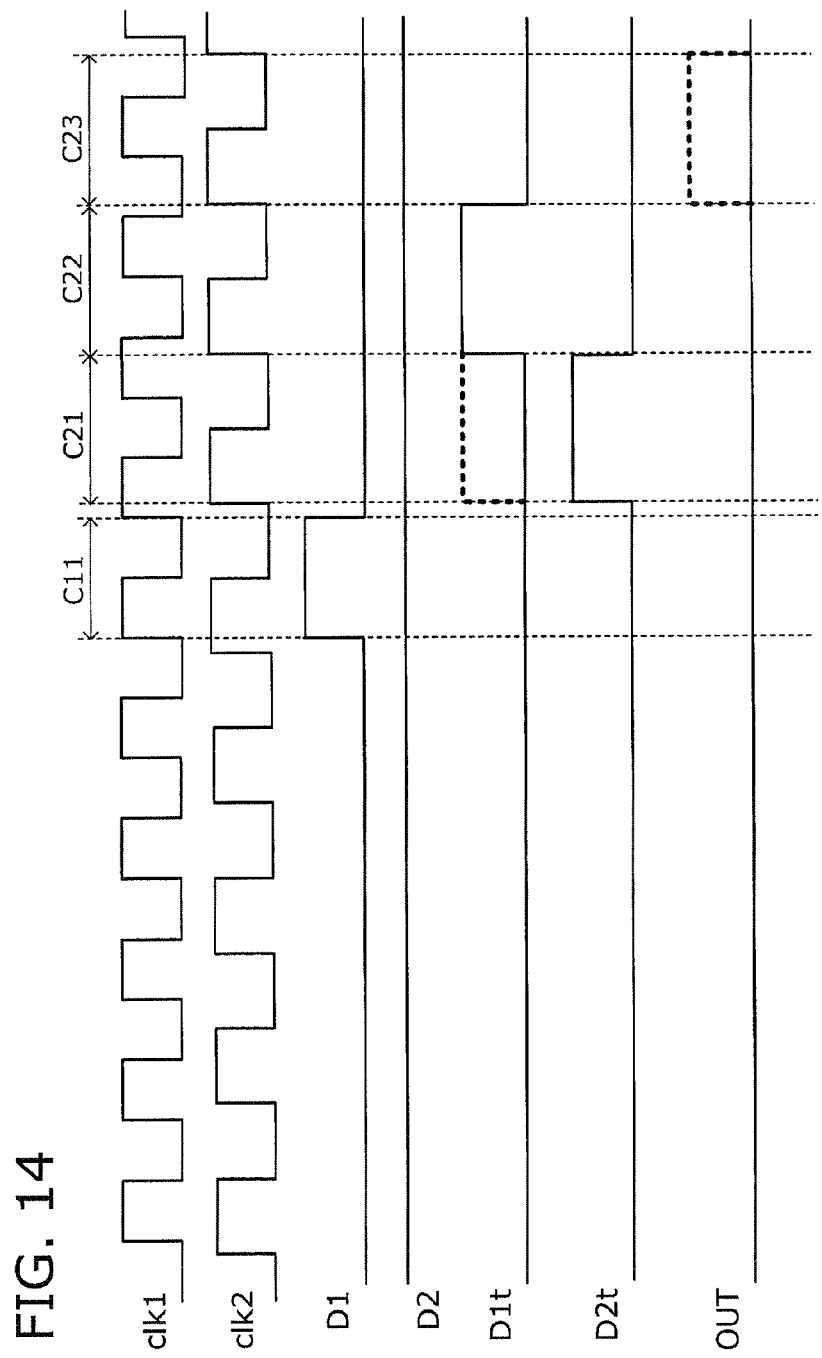
Figure 15:
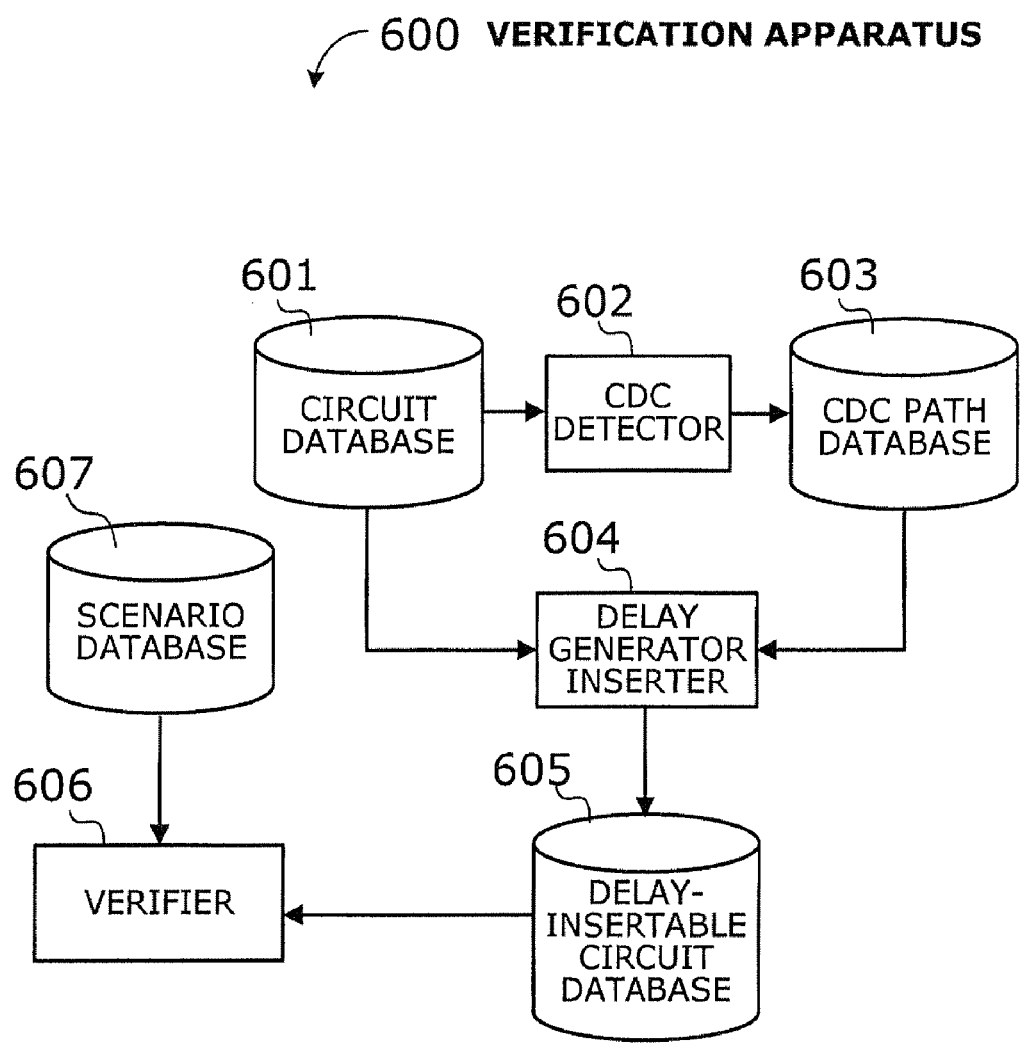
FIG. 15 gives an overview of a conventional verification apparatus.
Figure 16:
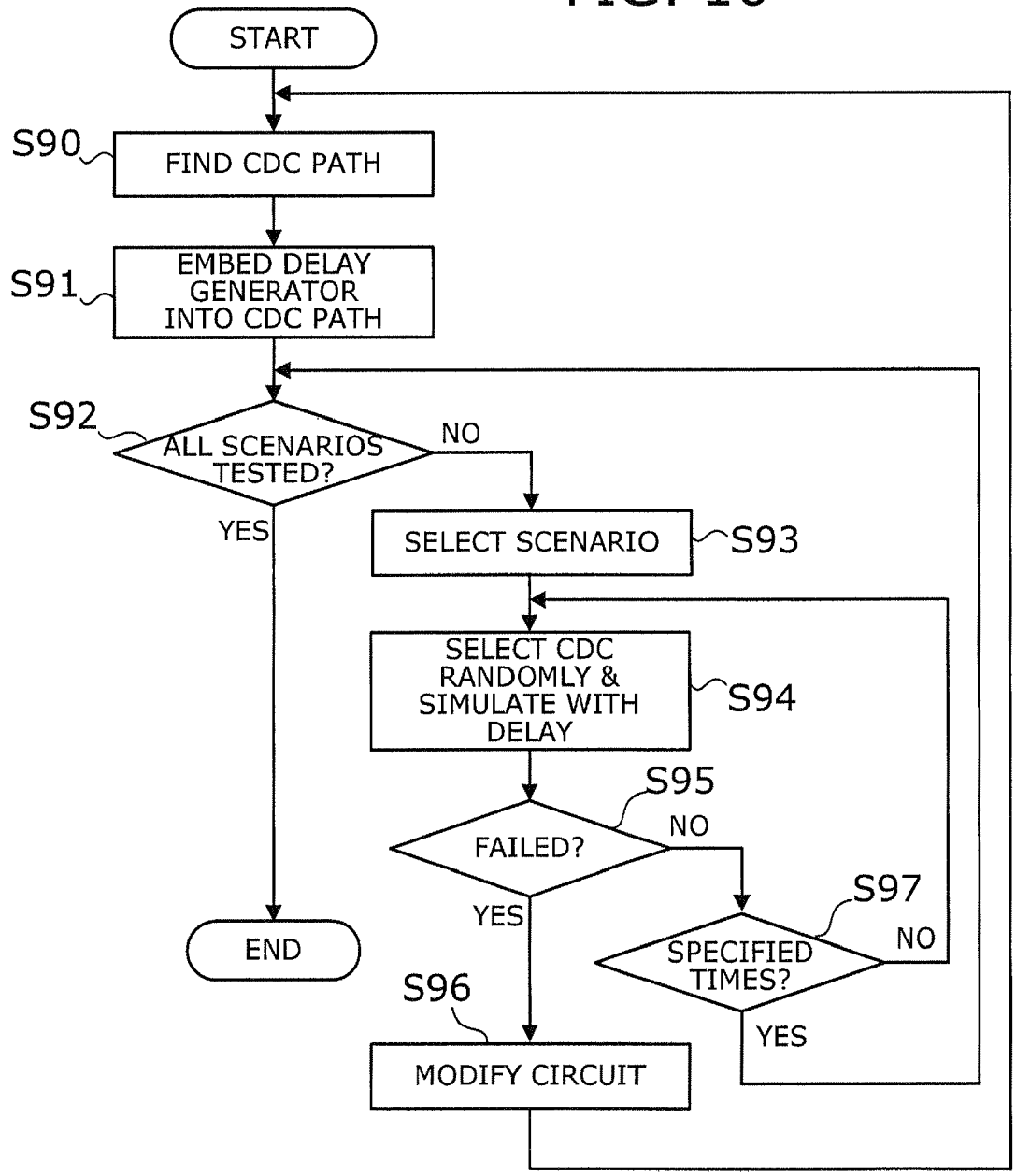
FIG. 16 is a flowchart showing a conventional verification method.
Figure 17:
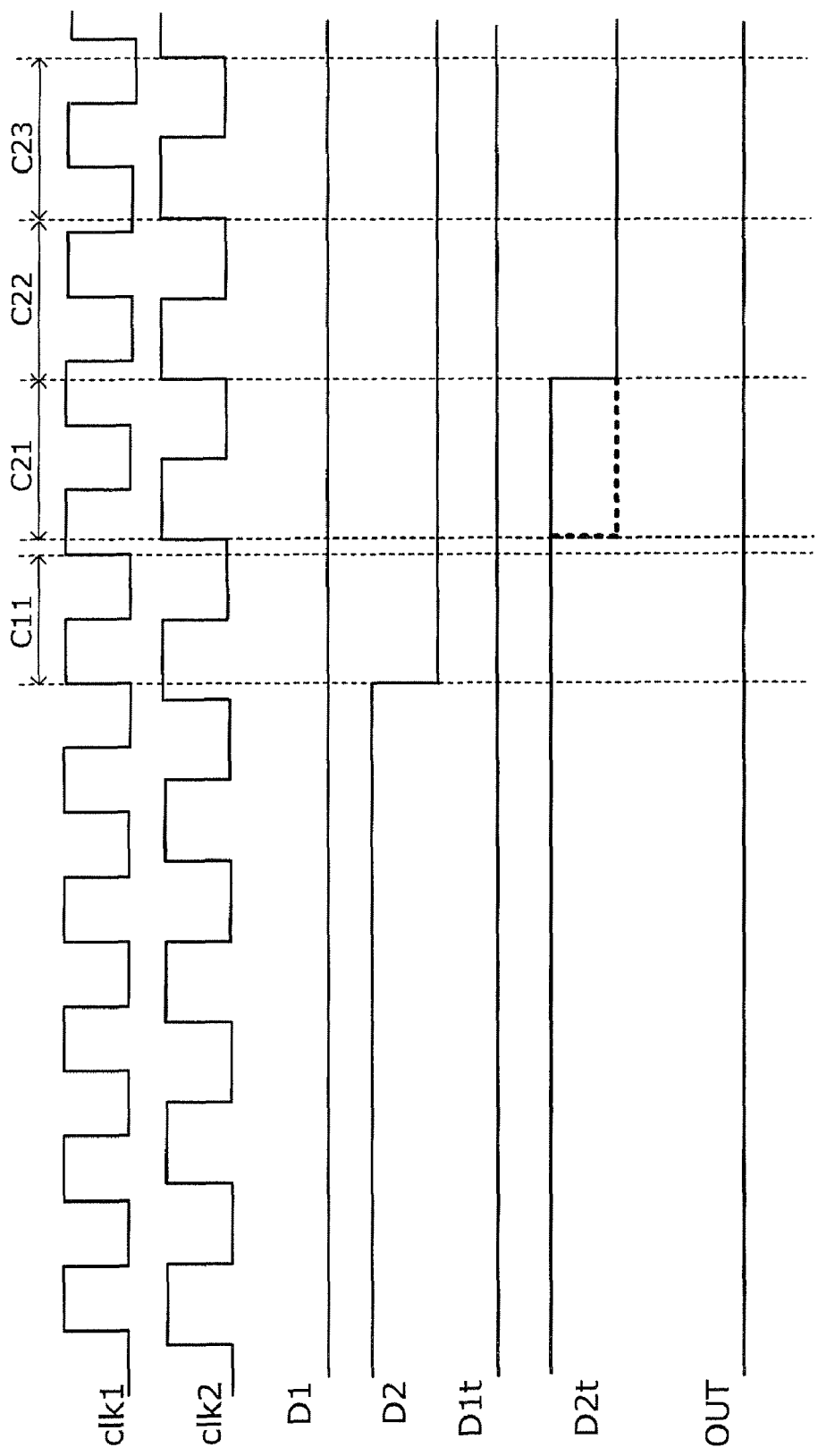
FIG. 17 is a timing diagram showing an example case where the circuit's output is not affected by delays in a CDC path.

FIG. 6 shows an example of a delay-insertable circuit. This circuit is equivalent to the circuit discussed earlier in FIG. 13, while containing delay generators. The circuit under test has two CDC paths 510 and 511, which contain delay generators 401 and 402 (see FIG. 2 for their structure) controlled by delay generator enable signals "meta_on1" and "meta_on2," respectively.

Figure 7:
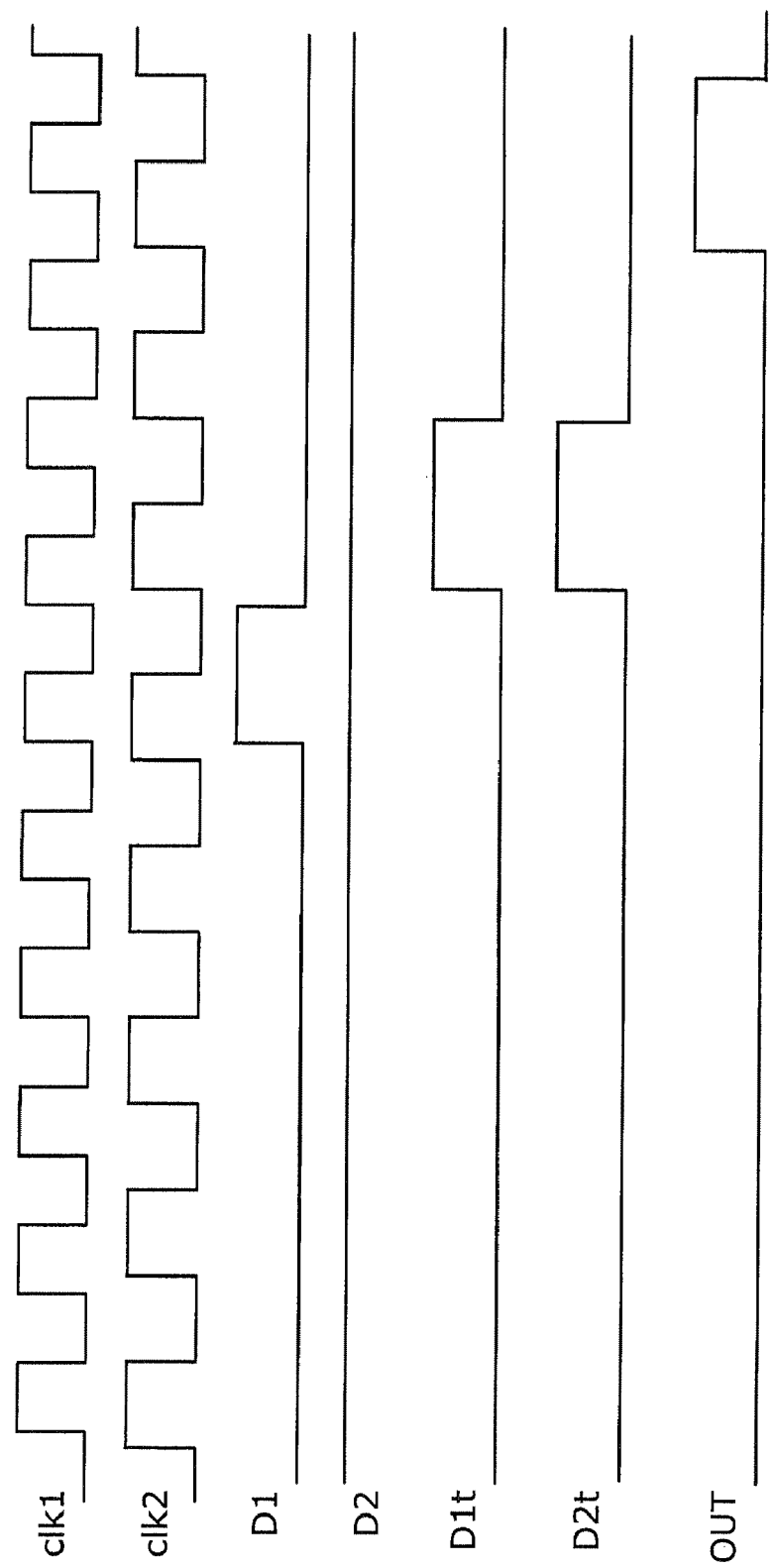
FIG. 7 is a timing diagram showing an example of simulation results.

FIG. 7 is a timing diagram showing an example of a simulation result obtained from the circuit of FIG. 6 under a specific scenario. The model checking method regards the time series of clock signals clk1 and clk2 and input signals D1 and D2 as input constraints. The method also regards the time series of output signal OUT as output constraints. The delay-insertable circuit of FIG. 6 is entered as a model to be checked. No constraints are given to the delay generator enable signals meta_on1 and meta_on2, so that the model checking method can manipulate these signals as necessary at time points when metastability could occur. More specifically, the model verification method tests whether the circuit satisfies given output constraints however the signals meta_on1 and meta_on2 may vary. If there is a pattern of meta_on1 and meta_on2 failing to satisfy the output constraints, then the method outputs that pattern as a counterexample. The present embodiment detects a pattern of delay generator enable signals that changes the output signal OUT as a result of metastability.

Specifically, the output signal OUT is supposed to behave in the way shown in the bottom row of FIG. 7. If the output signal OUT behaves in a different way when the delay generator enable signal meta_on1 and meta_on2 are varied, then the circuit under test is deemed to violate the output constraints. The state of delay generator enable signals meta_on1 and meta_on2 at that time represents a delay pattern that affects the output signal OUT.

Figure 8:
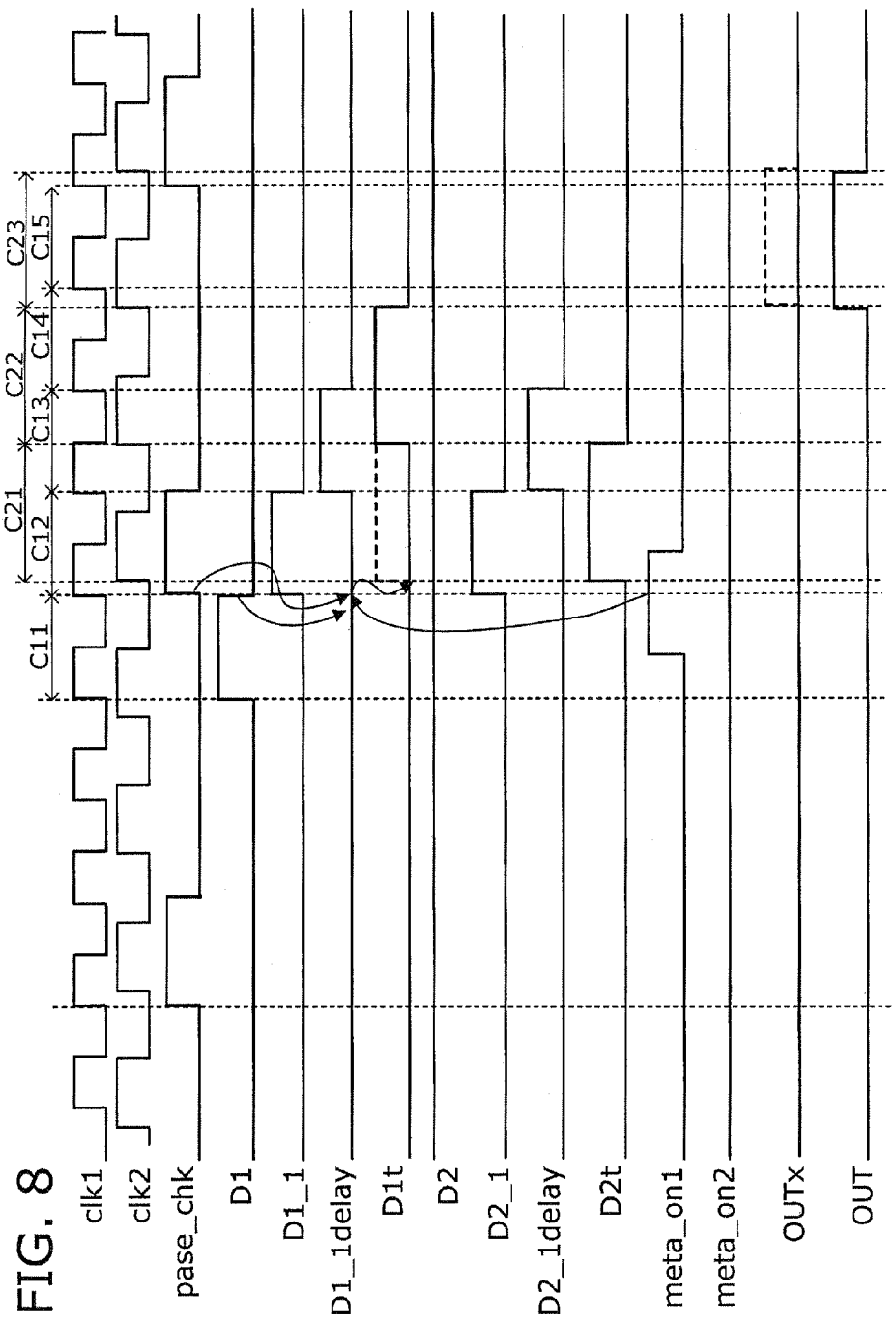
FIG. 8 shows an example delay pattern that may affect the output signal OUT of the delay-insertable circuit of FIG. 6.

FIG. 8 shows an example delay pattern that affects the output signal OUT of the delay-insertable circuit of FIG. 6. C11, C12, C13, C14, and C15 represent cycle periods of the first clock signal clk1. C21, C22, and C23 represent those of the second clock signal clk2. While most signals shown in FIG. 8 have already been discussed earlier in FIG. 6, the following signals need clarification. Signal pase_chk is what the phase discriminator 212 (FIG. 2) outputs in delay generators 401 and 402 (FIG. 6), which becomes "1" when the rising edges of two clock signals clk1 and clk2 are close to each other. Signals D1_1delay and D2_1delay are a one-clock delayed version of D1_1 and D2_1, which are produced and used inside the delay generators 401 and 402, respectively (see FIG. 2).

Referring to the timing diagram of FIG. 8, the input signal D1 changes at a rising edge of the first clock signal clk1 during period C12, and at the same time, pase_chk becomes "1." The delay generator 401 is activated at this moment by setting meta_on1 to "1." This situation causes the delay generator 401 to output D1_1delay, a one-clock delayed version of D1_1. The subsequent flip-flop 503 captures this signal at a rising edge of the second clock signal clk2 during period C22, thus setting D1*t* to "1." As a result, the circuit produces an output signal OUTx in a different way from its expected output signal OUT given as an output constraint. Accordingly a delay pattern corresponding to the delay generator enable signals meta_on1 and meta_on2 shown in FIG. 8 is detected as affecting the output signal OUT.

As can be seen from the above, the verification apparatus 100 of the first embodiment verifies the circuit under test in terms of metastability that could change the behavior of output signals appearing at terminals. This optimized scope of testing reduces the time required for circuit verification. The first embodiment generates delay patterns not exhaustively for every existing CDC path and time point, but selectively for CDC paths and time points that are susceptible to metastability, thus further reducing the verification time.

Second Embodiment

Figure 9:
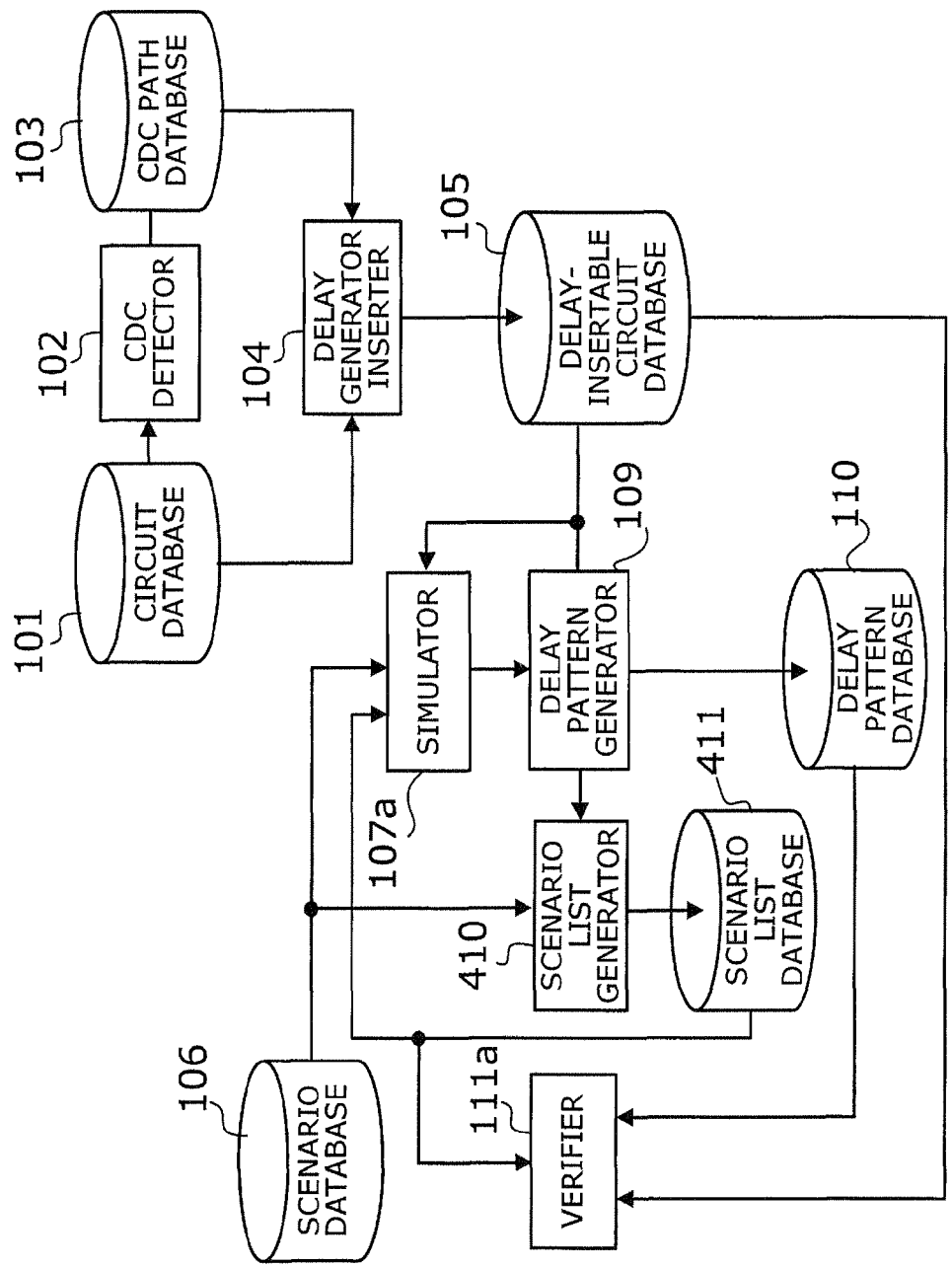
FIG. 9 is a functional block diagram of a verification apparatus according to a second embodiment of the present invention.

FIG. 9 is a functional block diagram of a verification apparatus 100*a* according to a second embodiment of the present invention. Since some elements shown in FIG. 9 are similar to those of the first embodiment, the following explanation will focus on the difference between the two embodiments, while assigning like reference numerals to like elements.

The verification apparatus 100*a* of the second embodiment differs from the verification apparatus 100 of the first embodiment in that the former has a scenario list generator 410 to create a scenario list and a scenario list database 411 to store the created scenario list. This scenario list contains a set of particular scenarios that may affect output signals of the circuit under test. The scenario list generator 410 collects such scenarios from those stored in the scenario database 106. The second embodiment also has a verifier 111*a* designed to use a scenario list for scenario-based verification.

Specifically, the proposed verification apparatus 100*a* creates a scenario list as follows. First, the verification apparatus 100*a* produces a delay-insertable circuit and saves it in the delay-insertable circuit database 105 in the same way as the verification apparatus 100 does in the first embodiment. The verification apparatus 100*a* then activates its simulator 107*a* to perform a simulation of the delay-insertable circuit, using a scenario stored in the scenario database 106. Based on the delay-insertable circuit and its simulation result, the delay pattern generator 109 produces delay patterns that affect output signals of the delay-insertable circuit. If such delay patterns are actually produced, then the scenario list generator 410 adds the scenario used in the simulation as a new entry of the scenario list.

The above process is repeated for all scenarios stored in the scenario database 106. The resulting scenario list contains a set of particular scenarios used to produce delay patterns that affect output signals of the circuit. The scenario list database 411 stores this scenario list for later use.

The verification apparatus 100a according to the second embodiment then verifies the circuit under test. Specifically, the verifier 111a selects a scenario from the scenario list in the scenario list database 411, as well as a delay pattern from the delay pattern database 110. Using the selected scenario and delay pattern, the verifier 111a verifies the circuit's immunity to metastability. More details on the verification apparatus 100a will follow.

The verification apparatus 100a of the second embodiment is implemented on a computer system 300 shown in FIG. 4 similarly to the verification apparatus 100 of the first embodiment. On such a hardware platform, the verification apparatus 100a processes data as follows.

Figure 10:
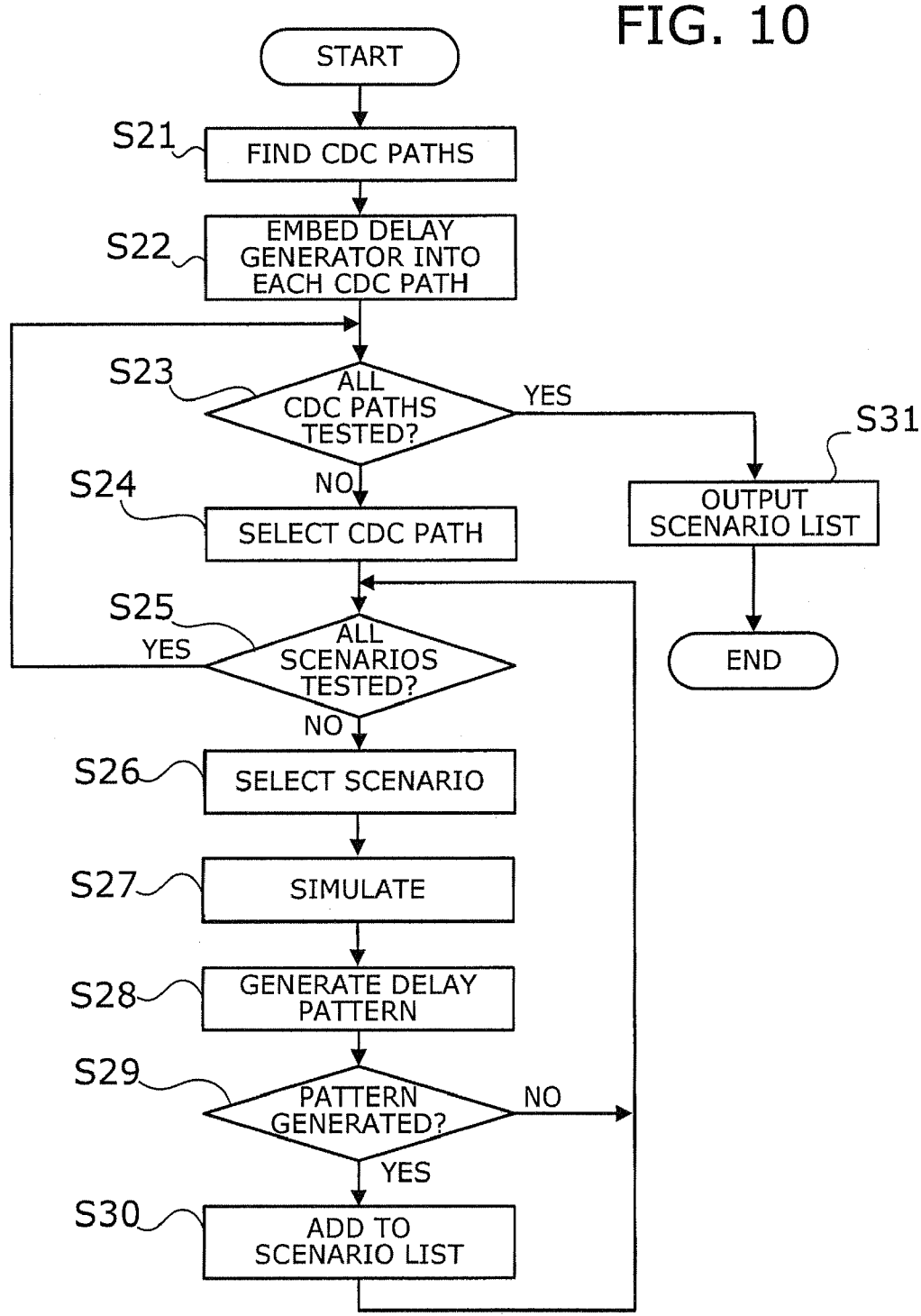
FIG. 10 is a flowchart of a process to produce a scenario list.

Referring now to the flowchart of FIG. 10, the following will specifically describe a process of creating a scenario list.

The CPU 301 finds CDC paths in the circuit under test (step S21) and produces a delay-insertable circuit by embedding a delay generator to each found CDC path (step S22). The CPU 301 checks whether all CDC paths have been tested in simulation (step S23). If there are untested CDC paths, the CPU 301 selects a new CDC path for simulation (step S24). The CPU 301 then checks whether all scenarios have been tested in simulation (step S25). If so, the process returns to step S23. If there are untested scenarios, the CPU 301 selects a new scenario (step S26) to execute a simulation with that scenario (step S27). From the delay-insertable circuit and its simulation results, the CPU 301 generates delay patterns that may affect output signal of the circuit by using techniques discussed in FIGS. 6 to 8 (step S28). The CPU 301 determines whether it has successfully produced delay patterns from the selected combination of CDC paths and scenario (step S29). In the case where no delay patterns are produced, the CPU 301 returns to step S25 to repeat the above process. If delay patterns are produced, the CPU 301 adds the currently selected scenario to the scenario list (step S30) before returning to step S25.

Referring back to step S23, the CPU 301 proceeds to step S31 when it finds that all CDC paths have been tested. The CPU 301 saves the resulting scenario list in the HDD 304, for example (step S31).

Step S30 marks the CDC paths for which delay patterns are generated. The marked CDC paths are recorded in a storage device (e.g., HDD 304), along with the selected scenario. Step S31 outputs a scenario list that includes those recorded scenarios. At this time the CPU 301 may show unmarked CDC paths on a screen of the monitor 305a. The CPU 301 may also show the scenario list associated with marked CDC paths. This information permits the user to know how effectively the produced scenario list can test the CDC paths.

Figure 11:
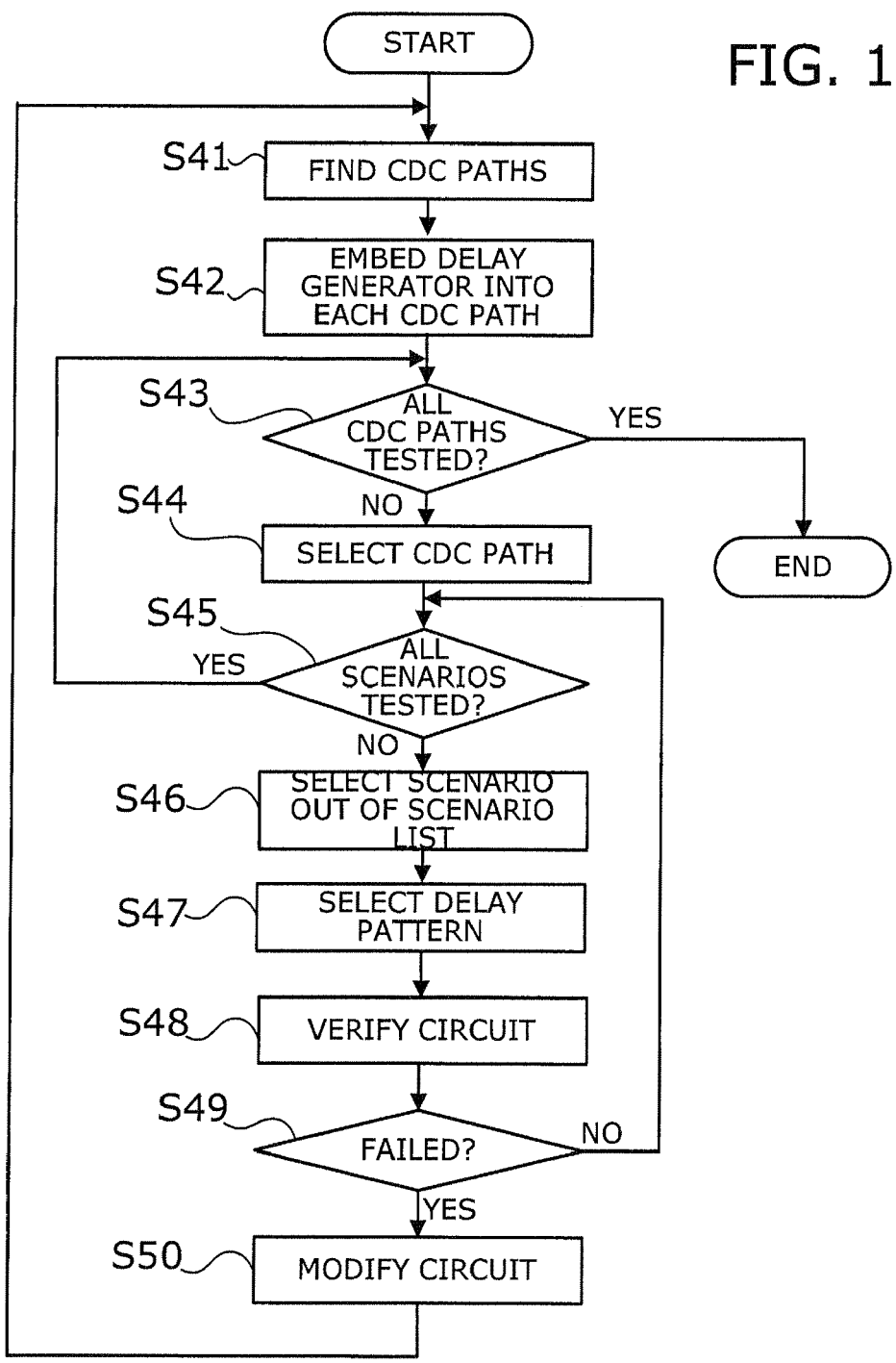
FIG. 11 is a flowchart of a verification process using a scenario list.
Figure 12A:
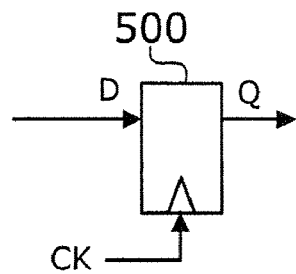
FIGS. 12A and 12B show an example of how a flip-flop circuit behaves when it encounters metastability.
Figure 12B:
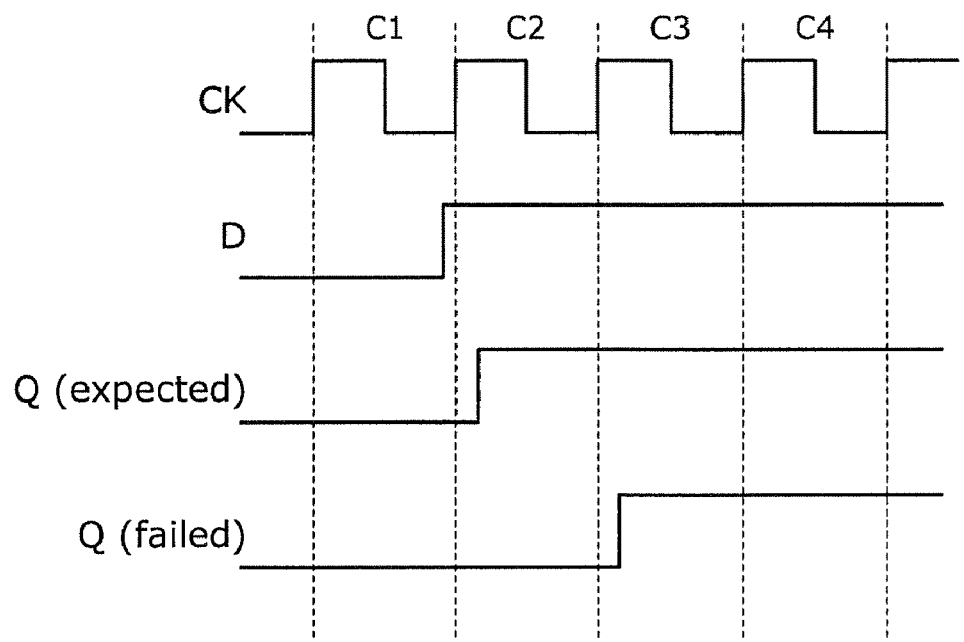

The scenario list produced in the way described above is then used in a verification process shown in the flowchart of FIG. 11. This process begins with steps S41 and S42, which are equivalent to steps S21 and S22 explained earlier in FIG. 10. The CPU 301 checks whether all CDC paths have been tested in simulation (step S43). If there are untested CDC paths, the CPU 301 selects a new CDC path for simulation (step S44). The CPU 301 then checks whether all scenarios have been tested in simulation (step S45). If so, the process returns to step S43. If there are untested scenarios, the CPU 301 selects a new scenario from the scenario list stored in the HDD 304 (step S46). The CPU 301 also selects an appropriate delay pattern for the selected scenario from among those stored in the delay pattern database 110 (step S47). The CPU 301 verifies the delay-insertable circuit in terms of its immunity to metastability by giving delays to the selected scenario according to the selected delay pattern (step S48). The CPU 301 determines whether the circuit has passed the verification (step S49) and returns to step S45 if there are no failures found. If any failure is found, the CPU 301 outputs a message on the monitor 305a to notify the user of the problem. The user modifies the circuit to solve the problem and stores the modified circuit data into the HDD 304 (step S50). With the new version of the circuit data, the CPU 301 repeats the above verification process from step S41.

As can be seen from the above, the verification apparatus 100a of the second embodiment verifies a circuit in terms of its immunity to metastability by generating delay patterns that could change the behavior of output signals of the circuit, while skipping meaningless cases where metastability is confined within a limited portion of the circuit and never appears at output pins. This optimized scope of testing reduces the time required for circuit verification. In addition, the verification apparatus 100a uses a limited number of scenarios with which it has produced delay patterns. This feature eliminates the need for trying many scenarios exhaustively, thus making it possible to further reduce the verification time.

Computer-Readable Medium

The above-described functional elements and process flows of the verification apparatuses 100 and 100a according to the first and second embodiments are implemented as computer programs executed on the computer system 300 shown in FIG. 4, the instructions being encoded and provided in the form of computer programs. The computer system executes such programs to provide the intended functions of the present invention, and the programs may be stored in a computer-readable storage medium. The suitable computer-readable storage media include magnetic storage media, optical discs, magneto-optical storage media, and solid state memory devices. Magnetic storage media include hard disk drives (HDD), flexible disks (FD), and magnetic tapes. Optical disc media include digital versatile discs (DVD), DVD-RAM, compact disc read-only memory (CD-ROM), CD-Recordable (CD-R), and CD-Rewritable (CD-RW). Magneto-optical storage media include magneto-optical discs (MO).

Portable storage media, such as DVD and CD-ROM, are suitable for distribution of program products. Network-based distribution of software programs may also be possible, in which case several master program files are made available on a server computer for downloading to other computers via a network.

A user computer stores necessary software components in its local storage unit, which have previously been installed from a portable storage media or downloaded from a server computer. The computer executes the programs read out of the local storage unit, thereby performing the programmed functions. As an alternative way of program execution, the computer may execute programs directly from a portable storage medium while reading out necessary program files. Another alternative method is that the user computer dynamically downloads programs from a server computer when they are demanded and executes them upon delivery.

CONCLUSION

To summarize the above discussion, the present invention produces a delay pattern for CDC paths found in a circuit. The produced delay pattern may affect output signals of the circuit and is thus used to verify the circuit in terms of its immunity to metastability, without the need for testing metastable states confined within the circuit. The present invention, therefore, greatly reduces the time required for circuit verification.

All or part of the functional elements of verification apparatuses 100 and 100a according to the first and second embodiments may be implemented in hardware logic such as large-scale integrated (LSI) circuits. While the foregoing description has assumed the use of two clock domains in a circuit, the proposed verification technique can also be applied to circuits using three or more clock signals.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An apparatus for verifying a circuit operating with a plurality of different clock signals, the apparatus comprising:
   a clock domain crossing (CDC) detector that finds CDC paths between circuit elements operating with different clocks in the circuit;
   a delay generator inserter that produces a delay-insertable version of the circuit by embedding a delay generator into each CDC path found in the circuit, wherein the delay generators, when activated, give a signal delay to the corresponding CDC paths;
   a simulator that performs a simulation of the delay-insertable circuit by using a specified simulation pattern;
   a potential CDC path finder that extracts CDC paths that could encounter metastability from among the CDC paths of the delay insertable circuit, together with time points when that metastability could occur, based on results of the simulation and the delay-insertable circuit;
   a delay pattern generator that generates a delay pattern that affects an output signal of the delay-insertable circuit, from the results of the simulation and the delay-insertable circuit, along with the extracted CDC paths that could encounter metastability and the time points when the metastability could occur; and
   a verifier that generates a delay according to the generated delay pattern that affects the output signal of the delay-insertable circuit, and tests immunity from metastability that affects the output signal of the delay-insertable circuit.

2. The apparatus according to claim 1, further comprising a simulation pattern database storing a set of simulation patterns with which the delay pattern generator has successfully produced delay patterns.

3. The apparatus according to claim 2, wherein the simulator performs the simulation by using the simulation patterns stored in the simulation pattern database.

4. The apparatus according to claim 2, further comprising a verification condition display unit that records the CDC paths involved in the generated delay pattern and displays the set of simulation patterns, together with CDC paths that are not involved in the delay pattern.

5. A method of verifying a circuit that operates with a plurality of different clock signals, the method comprising using a computer for performing functions including:
   finding clock domain crossing (CDC) paths between circuit elements operating with different clocks in the circuit;
   producing a delay-insertable version of the circuit by embedding a delay generator into each CDC path found in the circuit, wherein the delay generators, when activated, give a signal delay to the corresponding CDC paths;
   performing a simulation of the delay-insertable circuit by using a specified simulation pattern;
   examining each of the CDC paths of the delay-insertable circuit and extracting ones thereof that could encounter metastability together with time points when that metastability could occur, based on results of the simulation and the delay-insertable circuit;
   generating a delay pattern that affects an output signal of the delay-insertable circuit, from the results of the simulation and the delay-insertable circuit, along with the extracted CDC paths that could encounter metastability and the time points when the metastability could occur; and
   verifying behaviors of the circuit including
      generating a delay according to the generated delay pattern that affects the output signal of the delay-insertable circuit, and
      testing immunity from metastability that affects the output signal of the delay-insertable circuit.

6. The method according to claim 5, further comprising storing a set of simulation patterns with which a delay pattern has successfully been produced.

7. The method according to claim 6, wherein the simulation is performed by using the stored set of simulation patterns.

8. The method according to claim 6, further comprising:
   recording the CDC paths involved in the delay pattern; and
   displaying the set of simulation patterns, together with CDC paths that are not involved in the delay pattern.

9. A non-transitory computer-readable medium storing a program for verifying a circuit that operates with a plurality of different clock signals, the program causing a computer to function as:
   a clock domain crossing (CDC) detector that finds CDC paths between circuit elements operating with different clocks in the circuit;
   a delay generator inserter that produces a delay-insertable version of the circuit by embedding a delay generator into each CDC path found in the circuit, wherein the delay generators, when activated, give a signal delay to the corresponding CDC paths;
   a simulator that performs a simulation of the delay-insertable circuit by using a specified simulation pattern;
   a potential CDC path finder that extracts CDC paths that could encounter metastability from among the CDC paths of the delay insertable circuit, together with time points when that metastability could occur, based on results of the simulation and the delay-insertable circuit;
   a delay pattern generator that generates a delay pattern that affects an output signal of the delay-insertable circuit, from the results of the simulation and the delay-insertable circuit, along with the extracted CDC paths that could encounter metastability and the time points when the metastability could occur;
   a verifier that generates a delay according to the generated delay pattern that affects the output signal of the delay-insertable circuit, and tests immunity from metastability that affects the output signal of the delay-insertable circuit.

* * * * *